United States Patent [19]

Colacino et al.

[11] 4,409,319

[45] Oct. 11, 1983

[54] ELECTRON BEAM EXPOSED POSITIVE RESIST MASK PROCESS

[75] Inventors: James J. Colacino, Stromville, NY; Ronald A. Leone, Satellite Beach, Fla.

[73] Assignee: International Business Machines Corporation, Armonk, N.Y.

[21] Appl. No.: 283,695

[22] Filed: Jul. 15, 1981

[51] Int. Cl.³ .............................................. G03C 5/04
[52] U.S. Cl. .................................... 430/296; 430/326; 430/330; 430/312; 430/317; 156/643; 156/644; 156/647; 156/661.1; 156/659.1
[58] Field of Search ............... 430/296, 326, 330, 312, 430/317; 156/643, 644, 647, 661.1, 659.1

[56] References Cited

U.S. PATENT DOCUMENTS

| | | | |
|---|---|---|---|
| 3,549,368 | 7/1968 | Collins et al. | 430/317 |
| 3,751,248 | 8/1973 | Goell | 430/312 |
| 3,852,771 | 12/1974 | Ross et al. | 430/296 |
| 3,961,101 | 6/1976 | Barton | 430/296 |
| 4,015,986 | 4/1977 | Paal et al. | 430/330 |
| 4,184,909 | 1/1980 | Chang et al. | 156/643 |

OTHER PUBLICATIONS

Shaw et al., J. Electrochem. Soc.: Solid-State Science and Technology, vol. 126, No. 11, Nov. 1979, pp. 2026-2031.
Dill et al., IBM Journal of R. and D., vol. 21, No. 3, May 1977, pp. 210-218.
Jinno et al., Photographic Science and Eng., vol. 21, No. 5, Sep.-Oct. 1977, pp. 290-292.
Bickford et al., IBM Tech. Dis. Bul., vol. 16, No. 1, Jun. 1973, p. 47.
Babie et al., IBM Tech. Dis. Bul., vol. 23, No. 7A, Dec. 1980, p. 2767.
Koste et al., IBM Tech. Dis. Bul., vol. 22, No. 7, Dec. 1979.
Agnihotri et al., IBM Tech. Dis. Bul., vol. 22, No. 5, Oct. 1979.
Cook et al., IBM Tech. Dis. Bul., vol. 20, No. 2, Jul. 1977.

*Primary Examiner*—Norman Morgenstern
*Assistant Examiner*—Richard Bueker
*Attorney, Agent, or Firm*—Henry Powers

[57] ABSTRACT

An E-beam lithography process for forming via holes in insulating layers, such as quartz, on semiconductor devices. Where quartz is used, an underlayer of an adhesion promoter is used (e.g. KMR resist which is desensitized by heating) followed by overcoating with an E-beam sensitive positive image resist layer of the novolak/diazobenzophenone family. After exposure with an E-beam the development is performed at low temperatures (e.g. 14° C.) with end-point detection to indicate a further degree of overdevelopment, followed by controlled heating to post-bake of the image resist to obtain round and properly tapered via holes.

11 Claims, 13 Drawing Figures

DEVELOPED

FIG. 9

POST BAKED

18 200 μ" ETCHED WITH RESIST

VIA TEST SITE
· E-BEAM "220 NS" EXPOSURE
· 200 x 200 μ" VIAS
· AFTER RIE, BEFORE RESIST STRIP

ELECTRON BEAM EXPOSED POSITIVE RESIST MASK PROCESS

DESCRIPTION

Technical Field

This invention relates to the formation of positive resist masks on semiconductor devices using high energy electron beam radiation, and more particularly to the development of said exposed resist masks with horizontal and vertical control of via hole dimensions.

One object of the present invention is to provide a mask development technique which gives improved control of via hole formation.

Another object of the present invention is to provide improved uniformity of via hole dimensions in development of E-beam exposed positive resists.

Another object of the present invention is to provide improved control of the horizontal and vertical dimensions of via hole formation during development of E-beam exposed positive resists.

Another object of the present invention is to provide a novel masking technique with improved and consistent via-hole profiles.

Another object of the present invention is to provide a novel masking and development technique for E-beam exposed positive resists which results in via-holes with improved sidewall taper, especially for small via hole geometries.

Another object of the present invention is to provide a novel masking and development technique with improved reproducibility.

Background Art

Advances in modern semiconductor device technology have allowed increasing numbers of devices and circuits to be fabricated within a single semiconductor chip. This has required increasing microminiaturization of both the semiconductor elements as well as the interconnection metallurgy which connect the elements within the chip into circuits. Such miniaturization results in decreased costs and improved performance in integrated circuits; but it is constantly crowding the fabrication technology, particularly the photolithographic and etching techniques of the interconnection metallurgy.

In integrated circuit logic and memory design, for example many thousands of impurity regions are conventionally fabricated in a silicon chip approximately 125-200 mils square. Such regions form transistors, diodes, resistors and the like which are then connected together by the metallurgical patterns atop the chip to form various circuits and for connection to input-output terminals.

This interconnection metallurgy system atop the chip is extremely complex and usually employs two or three separate levels of complex thin film conductor patterns, each separated by one or more layers of dielectric material. Ordinarily, the first level conductive patterns on the chip surface interconnects the transistors, resistors, diodes, etc. into circuits and also provides for circuit-to-circuit connections. The latter function is usually provided by parallel conductive lines connected to the individual circuits. The second level conductive pattern conventionally completes the circuit-to-circuit connection and makes contact to I/O terminals which are connectable to a support such as a module, substrate or card. The second level usually consists of parallel lines that are transverse to the aforementioned parallel lines of the underlying first level conductive pattern. In advanced designs third, and even fourth, levels may be required for power and I/O connections.

At present it is necessary to etch the dielectric layers to form feedthrough patterns from one level to another. The standard process of interconnecting one level of metallurgy to another involves depositing an insulator such as $SiO_2$ atop a first level metallurgical pattern disposed on a substrate. The glass is typically deposited pyrolytically, although the sputtered glass position process described in U.S. Pat. No. 3,983,022 of Auyang et al. can be employed.

A photoresist layer is then deposited, exposed and developed so that the via hole pattern is formed in the photoresist over the glass. The exposed glass portions are then etched to form the via holes down to the first level metallurgy. A second level metallurgical pattern is then deposited atop the remaining glass layer and into the via holes for connection to the first level pattern.

The formation of positive resist masks from layers of radiation degradable polymers is described, for example, by Haller and Hatzakis in U.S. Pat. No. 3,535,137. A radiation degradable polymer layer is coated on a substrate and is subjected to patternwise exposure by high energy radiation such as, for example, X-rays, nuclear radiation, and electrons. The irradiated regions of the polymer suffer a decrease in molecular weight and therefore become more rapidly soluble. A developer is then used to preferentially remove the irradiated portions of the layer. The substrate is then subjected to an additive or substractive process such as metallization or etching of said substrate with the remaining portions of the resist layer acting to protect the substrate.

Techniques have also been described by others for forming via holes for interconnection of several metal layers using reactive ion etching (RIE) of quartz insulator layers accompanied by suitable photolithographic processing, as described by J. A. Bondur et al. in their "Step Coverage Process with Projection Printing and Reactive Ion Etching" and "Step Coverage Process with Reactive Ion Etching Using Thermal Resist Effects", respectively, pages 3415-16 and 3413-14 of the February 1977 IBM-Technical Disclosure Bulletin, Volume 19, No. 9. As brought out therein, for reliable step coverage of a metal interconnection layer, etched insulator (oxide, quartz, etc.) slope angles of 50° to 60° are desirable in the via holes.

When using electron beam (E-beam) lithography in conjunction with reactive ion etching (RIE), one cannot utilize the same resist process for optical (e.g. UV) exposure. There are many complications which arise when E-beam lithography is used with RIE to form properly imaged and tapered via holes in insulator layers, such as $SiO_2$, quartz, polyimides and the like. For example, acrylic resists have RIE rates which are too high to make them effective masks in etching thick quartz layers for forming via-holes, whereas resists which serve as good RIE masks come from the novolak family such as Shipley's AZ 1350J, AZ 111, and the like, including a preferred resist system (hereinafter referred to as "HC") comprised of a cresol/formaldehyde and a diazo-benzophenone sensitizer, specifically 2,4-bis (6-diazo-5,6-dihydro-5-oxo-1-naphthalene-sulfonyl)-benzophenone sensitizer.

Processing E-beam exposed novolak resist, as for example the HC resist, is more complicated and demanding than processing the optically exposed forms. While development times for optical exposure are in the range of 0.5 to 2.0 minutes, E-beam exposure necessitates development times in the neighborhood of 8 to 10 minutes. These longer development times require an extremely good bond between the resist and substrate to avoid adhesion loss in the developer. Even the polysulfone adhesion layer used for optical lithographic processes become inadequate at the longer development times. Also, due to long development times the novolak (e.g. HC) resists have a tendency to de-adhere from some substrates, (e.g. quartz and oxide layers) during development.

BRIEF DESCRIPTION OF THE DRAWINGS

In the accompanying drawings forming a material part of this disclosure.

DISCLOSURE OF THE INVENTION

For further comprehension of the invention, and of the objects and advantages thereof, reference will be had to the following description and accompanying drawings and the the appended claims in which the novel features of the invention are more particularly set forth.

In accordance with the invention, there is provided a novel process or method for the specific purpose of reactive ion etching vias in insulating layers using E-beam lithography which substantially eliminates the disadvantages of the prior art, with specific application for reactive ion etching first level via-holes for interconnecting multilevel metallurgical patterns of integrated circuit substrates.

The invention comprises several critical processing steps, which taken as a whole, constitute the E-beam first via RIE process of this invention. The significant value of this invention is that as a whole, it meets its objectives only through the intricate interrelationship between the individual steps. The process is complex and each processing step has an effect on the others since the optimization of the process is achieved by designing each step to complement the others, which reproducibly forms vias whose horizontal dimensions are accurately controlled with vias having the proper vertical taper to insure second metal coverage and in turn, adequate reliability.

Although not required for polyimide insulating layers, with the use of insulating layers such as quartz and $SiO_2$, the invention initially requires the application of an adhesion promoter prior to the application of the imaging resist proper. A particularly effective adhesion promoter, for purposes of this invention is an underlay of about 1000 to about 2000 Å, typically of about 1400 Å, of Eastman Kodak's KMR resist which is a sensitized partially cyclized poly-cis-isoprene. This KMR resist underlay or layer is baked, e.g. about 160° C. to desensitize it during the bake cycle. The purpose of the underlay is to increase adhesion of the imaging resists, to quartz and $SiO_2$, during the development cycle. This KMR layer remains intact during resist development cycle, but is removed in the vias during the initial stages of the RIE operation.

The KMR resist is overcoated with a layer of a novolak imaging resist system (e.g. HC resist) which is sufficiently sensitive to an E-beam exposure density of about 5 to about 20 (e.g. 10) $\mu$ coulamb/cm$^2$, and which is not severely degraded during the RIE operation. The imaging resist can be applied in thicknesses of about 20,000 to about 30,000 Å, which illustratively for the HC resist would be about 25,000 Å. The imaging resist should also have a high ratio of development rate of exposed resist to the development rate of unexposed resist ($R/R_o$).

The imaging resist is then controllably E-beam exposed in accordance with the required via pattern. Occasionally images are exposed which are not integral multiples of the E-beam spot size. In such case, proper image size and sidewall taper can be achieved by suitable "graying" of the E-beam exposure. As used herein "graying" is reducing or increasing E-beam exposure times for each nominal via size, depending upon the desired size of that particular via. Graying also enables vias with multiple spot overlap to be developed and baked at the same conditions as the non-overlapped vias.

This invention also comprehends special resist developing parameters, which minimize imaging resist loss in the unexposed regions, and more importantly, to enable proper control of the developed image, both in the horizonal dimensions and sidewall taper. The developing is accomplished by utilizing a suitable developer, such as Shipley's commercially available KOH based AZ-1301 diluted with water in a 1:3 proportion, and developing at low temperatures in the range of about 13° to about 15° C., and illustratively of about 14° C.

Also contemplated is the use of develop end point detection (DEPD) techniques such as described by H. A. Khoury et al. in "Front Wafer Registration Device for Batch Process Etch End-Point Detection System" pp. 1756–59 of the October 1977 IBM-TDB, v. 20, no. 5, and by D. H. Jurczyk et al. in "Process Detection System" pp. 1867–70 of the November 1975 IBM-TDB, v. 18, no. 6.

The use of the DEPD enables reproducible image size control despite variations in pre-bake temperatures, resist development rates, E-beam exposure density, ambient light conditions, strength of developer and resist thickness. Developing times will vary based on the parameters noted above, and developing for fixed times will result in loss of image size integrity. The DEPD technique utilized in this process comprises the use of a suitably designed or dedicated test site with metal line widths and spaces characteristic of the product dimensions. More importantly, the technique utilizes the concept of DEPD "over-develop" which is in actuality a relationship between the time to develop in the test site vs. the time to properly open a via. Thus, the substrates or wafers are developed for a given time past full development of the resist in the test site. This additional time is referred to as $\Delta t$ and is a certain percentage of the time to reach end-point in the test site. The determination of the value of $\Delta t$ depends on several parameters, namely material properties and tool characteristics. More importantly, it depends on the via image size, which are exposed, and the exposure gray levels. By proper combination of gray level and $\Delta t$, all images on the wafer can be developed to specification. Typically, the overdevelop time, $\Delta t$, can be from about 10 to about 100%, and preferably from about 20 to about 40% of the time to reach end-point in the test site.

An additional important stage of this invention is controlled resist baking after development to properly cure and form the resist image. The baking cycle must be of such a nature as to controllably flow the resist to achieve a suitable sidewall taper, which will be reproduced in the insulator (e.g. quartz) layer during RIE. The baking cycle must also be of such a nature as to maintain proper horizontal dimensional control. Such a bake cycle can be achieved by a gradual heating over a time in the range of about 20 to about 60 minutes at a temperature of about 120° to about 160° C. One way of arriving at the bake temperature is by use of an oven (such as the Dr. Ing. A. Hoffman, Model: Horo of 7000 Stuttgart 50, Germany) set at a temperature of about 120° to about 140° C. with a thermal rise time of about 2 to about 10° C. per minute. The same baking effect can also be achieved by a three step bake at temperatures of about 80° to about 90° C., as for example, about 85° C., (e.g. hot plate) for about 10 to about 20 minutes, at about 100° to about 120° C., as for an example, 115° C. (e.g. in an oven) for about 10 to about 20 minutes followed by a final bake at about 130° to about 160° C., as example of about 150° C. (e.g. in an oven) for about 10 to about 20 minutes.

After development, the wafer or substrate is reactive ion etched to transfer the via of the resist through the desensitized resist under layer to the insulating layer, e.g. quartz, in a diode or other suitably configured system in a $CF_4 + O_2$ gas ambient.

Figure 3:
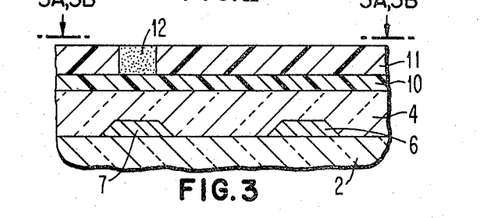
Figure 3A:
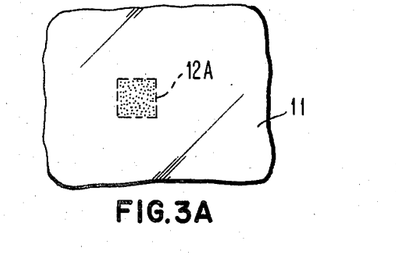
Figure 3B:
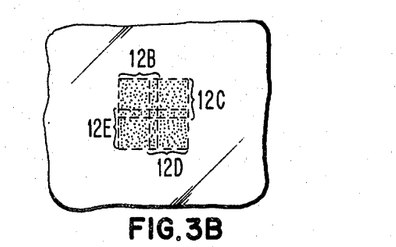
Figure 3C:
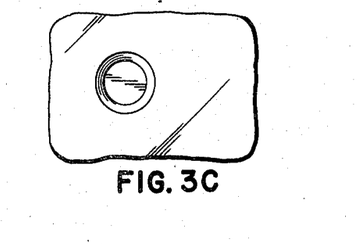

The process of this invention, if used correctly, has the ability to transform an E-beam exposed "square" via into a properly tapered "round" via hole, FIG. 3C. This process also enables tight control of horizontal dimensions of all different and varied via sizes exposed and etched on a wafer or substrate. Use of this process has produced dimensional control resulting in a $3\Sigma = 20\mu$ inch tolerance on etched vias.

In addition, the process disclosed and described herein either solves or eliminates the following problem:

Steep vertical profiles of etched vias result in reduced and unacceptable second level metal electromigration lifetimes. In contrast, this process produces properly tapered round vias from initially exposed square images. Proper shape and taper of the vias is produced by a low temperature develop stage and by a controlled image resist baking procedure;

A minimum thickness of the image resist layer to mask the RIE operation is needed. To achieve this, one can increase the initial thickness of the resist, which is impractical since it interferes with E-beam registration and also results in excessively long developing times. One can also use the technique of interrupted developing, whereby the Ro is artificially decreased by developing the wafer or substrate in steps. This is impractical since it does not lend itself to commercial manufacturing operations, and because the material characteristics (e.g. resist and developer) are not consistent enough to accurately specify the correct cycle times. The solution of this invention which is most practical and works best is a low temperature develop, which provides a suitable R/Ro, which leves adequate resist after development and baking to mask the RIE operation;

The ability to achieve reproducible and controlled image sizes, especially for small via geometries (approximately 5 $\mu$m), is one of the prime driving forces to use RIE. It is also one of the most difficult to achieve. The process of this invention produces a well controlled and very reproducible vias by the combination of "grayed" E-beam exposure, proper DEPD technique, low temperature develop, and controlled resist bake after development.

BEST MODE FOR CARRYING OUT THE INVENTION

Figure 1:
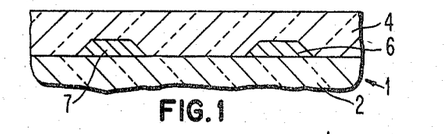
FIGS. 1 to 8 are diagrammatic cross-sectional views illustrating various stages of the masking technique of this invention, with FIGS. 3A to 3C are explanatory views of FIG. 3.
Figure 2:
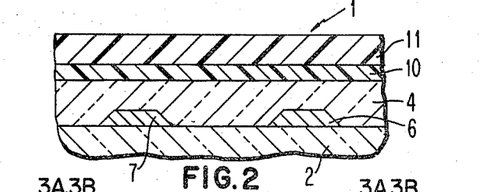

With reference to the drawings, FIG. 1 shows a cross-section of thin metallic films 6 and 7 of approximately 1 micron in thickness disposed on top of an insulative coating 2 of a substrate 1 and covered by a dielectic layer 4 (e.g. quartz) having a suitable thickness, as for example 2 to 2.5 microns. Films 6 and 7 comprise a portion of a first level conductive pattern which is generally interconnected through the insulator coating 2 to doped impurity regions within a semiconductor substrate 1 (not shown). Films 6 and 7 are also normally interconnected to other such films in said pattern on the same level to form device-to-device and circuit-to-circuit interconnections, as is well known in the art. One method of forming such films, 6 and 7 is by a lift-off method as described in the Franco et al. patent U.S. Pat No. 4,004,044.

Films 6 and 7 typically comprise aluminum, aluminum-copper alloys, alluminum-copper-silicon alloys as illustrative of other conductive films which can also be used.

Dielectric layer 4, as indicated can be a polyimide, $SiO_2$, glass or quartz or other suitable insulating composition employed in the art. Quartz is selected for purposes of this description, and which can be formed by conventional R.F. or D.C. sputtering techniques to cover the thin film pattern atop the substrate. If required, the quartz coating can be planarized by the technique described in U.S. Pat. No. 3,983,022. As will be understood, the substrate indicated in the drawings is a portion of an integrated circuit chip which is replicated in large number in a mother sheet or wafer.

In preparation for via hole formation the substrate/wafer, after inspection of the insulator coating 4, is cleaned in a chromic/nitric acid solution for sufficient time, e.g. about 5 minutes at room temperature followed by a $DIH_2O$ and blown dry, with a subsequent bake in an $N_2$ ambient oven for 30 minutes at about 160° C.±5°.

For surface preparation, the dried wafer was then static flooded with trifluoro-ammino-silane followed by spinning at 5500 RPM for 30 seconds. This is followed by the application of the Kodak KMR resist from 1:4 solution in xylene with spinning for 60 seconds at 4000 RPM which results in a coating of about 1500 to 1800 A±150 A, which after baking on a hotplate at 160° C.±5° for 30 minutes becomes desensitized to form the adhesion promoting underlayer 10.

At this point, the "HC" image resist layer 11 is applied from a solution of diglyme with spinning at 2200 RPM for 60 seconds to form a coating thickness of 26,500±750 A, with a nominal target of 2 to 3 microns. The resist is then prebaked suitably, as on a hot plate at 85±3° C. for 30 minutes.

The exposure of the image resist layer 11 is accomplished by a 100$\mu$ inch square E-beam in the desired pattern of openings 12 at appropriate voltage and dosage levels. A corresponding exposure of a via 12A (FIG. 3A) corresponding to the E-beam spot, the exposure can be effected in one pass at an energy of from about 20 KV to 30 KV at exposure times (e.g. 220 nanoseconds) to provide dosage levels of from about 5 to 20 coulamb/cm$^2$, as for example 10 coul/cm$^2$ normally at a beam current of 3 microamps. With lower energy levels the exposure can be effected with a plurality of passes at the via site 12A. For larger vias with larger dimensions a plurality of overlapping via targets can be employed, as for example the four exposed via sites 12B, 12C, 12D and 12E as shown in FIG. 3B.

Figure 4:
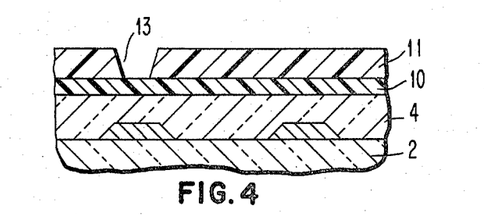
Figure 9:
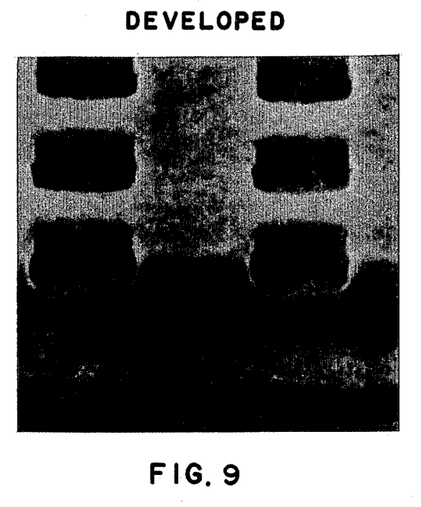
FIGS. 9 to 11B are photographic enlargements of test devices processed in accordance with this invention.

After exposure, the image resist layer 11 is developed in an alkyline medium, such as 1:3 mix of the Shipley AZ2401 with D.I. water, at a low temperatures of 14.5±0.1° C. followed by a DI H$_2$O rinse and a blow dry. This operation removes the latent image portions 12 of the image resist layer 11, which were exposed by the E-beam to form the access windows 13 to expose the underlying layer 10 as shown in FIG. 4. Generally 200×200μ inch latent images require from about 8 to about 10 minutes development time. The rectangular configurations of the vias in a test site is shown in FIG. 9.

Figure 10:
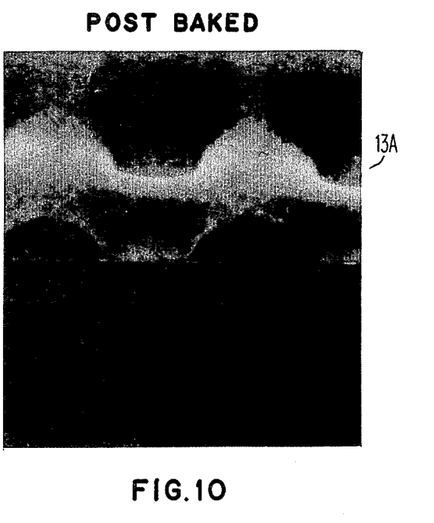

In accordance with the invention, the units are then subjected to a controlled post-bake, which can be effected at 125° C.±3° for about 40 minutes in a suitable oven (e.g., Horo, Despatch, etc.) suitably heated to temperature at a thermal rise time of about 2° to about 10° C. per minute. Alternatively, the units can be post-baked in three steps: for 20 minutes at 85±5° C. (hot plate); for 20 minutes at 115±5° C. (oven/air ambient); and for 20 minutes at 145±5° C. (oven/air). This post baking enables controlled flow of the image resist to transform the rectangular image via openings (FIG. 9) to properly tapered and rounded configurations as shown in FIG. 10.

Figure 5:
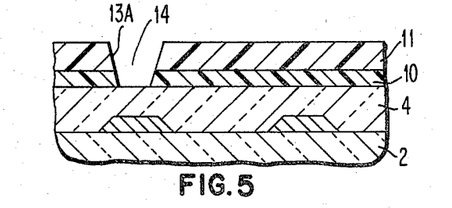
Figure 6:
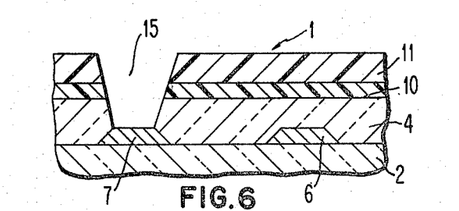
Figure 11:
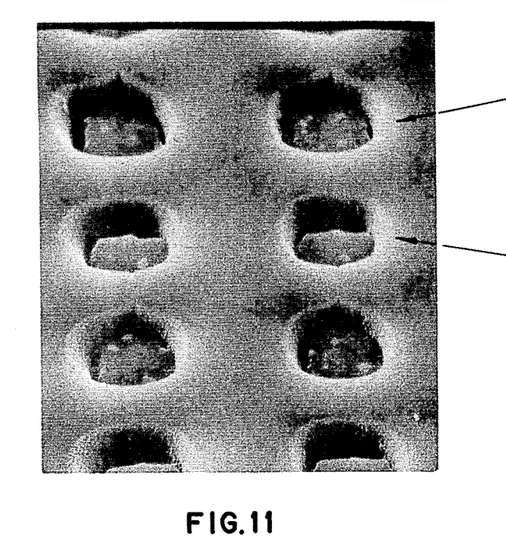
Figure 11A:
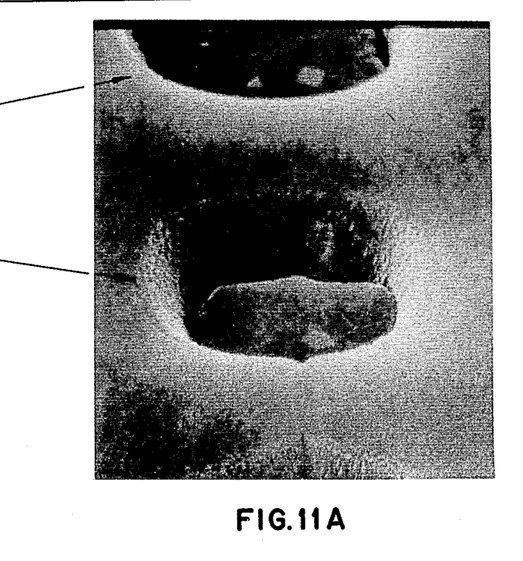
Figure 11B:
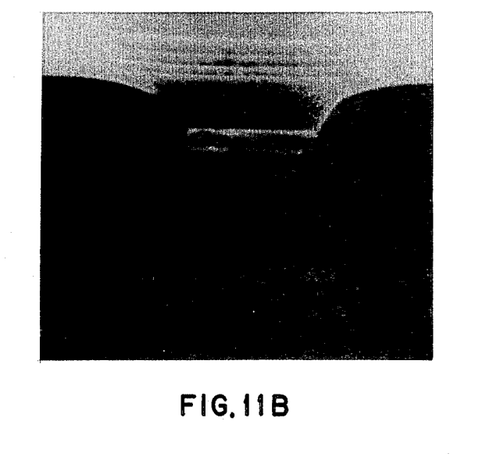

The portion of the resist underlayer 10 are then RIE etched in a suitable ambient e.g. CF$_4$+O$_2$ forming a via opening 14 (FIG. 5) to expose corresponding portions of the quartz layer 4, which is also RIE etched in a suitable ambient, e.g. CF$_4$+O$_2$ to open the via hole 15 over the conductor stripe 7 as shown in FIGS. 6 and 11 to 11B. During the RIE operation, the taper of the rounded via openings 13A in the image resist layer 11 is transferred to the via hole 15 in the quartz layer 4.

Figure 7:
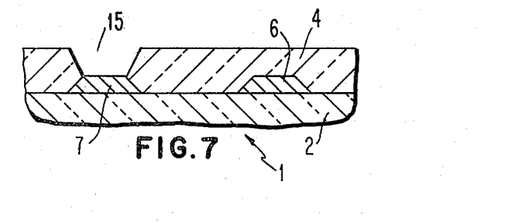

The remaining portions of the image resist layer 11 and the underlayer 10 are then stripped in any suitable manner, as by RF washing in 1 Torr, 5 cc O$_2$/min flow at 250 watts for 35 minutes. The stripped unit is then cleaned in chromic/nitric acid solution for 5 minutes at room temperature, DI-H$_2$O rinsed and N$_2$ blown dry to provide the structure of FIG. 7.

Figure 8:
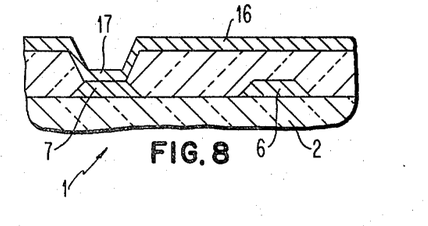

After inspection of the wafers, a second level of metallization 16 is then deposited with a via connection 17, in the via hole 15, to interconnect with the first level of metallization as presented by the conductor stripe 7. The deposition of the second level metallization 16/17 can be accomplished either by lift-offf processes or by blanket coating followed by substractive etching.

While the invention has been illustrated and described with preferred embodiments of this invention, it is to be understood that the invention is not to be limited to the precise construction herein disclosed and the right is reserved to all changes and modifications coming within the scope of the invention as defined in the appended claims.

We claim:

1. A method for forming a pattern of openings in an alkali soluble and a photosensitive diazo benzophenone positive resist system, comprising:

forming an adhesion promoter layer on a substrate wherein said adhesion promoter comprises a partially cyclized poly-cis-isoprene photoresist heating said adhesion promoter layer to desensitize it;

forming a layer of said resist system on and over said adhesion promoter layer;

exposing said resist with an electron beam in a predetermined pattern of said openings;

developing said exposed resist system in an alkaline medium at a temperature in the range of about 13° to 15° C.;

determining the time for completion of development of at least one of said openings over a dedicated portion of said substrate, and continuing the development of said resist system for an additional 10 to 100% of said time; and heating said developed resist pattern over a period of about 20 to about 60 minutes to a final temperature of about 120 to 160±5° C., and baking said resist at said final temperature for a time in the range of about 10 to about 20 minutes, wherein the last said heating is performed in a step-wise manner, with the first bake at a temperature of about 80 to 90±5° C. for about 10 to about 20 minutes, a second bake at a temperature of about 100° to about 120° C. for about 10 to about 20 minutes, and a bake at said final temperature for about 10 to about 20 minutes.

2. A method for forming a pattern of openings in an alkali soluble and a photosensitive diazo benzophenone positive resist system, comprising:

forming an adhesion promoter layer on a substrate, wherein said adhesion promoter comprises a partially cyclized poly-cis-isoprene photoresist;

heating said adhesion promoter to desensitize it;

forming a layer of said resist system on and over said adhesion promoter layer;

exposing said resist with an electron beam in a predetermined pattern of said opening;

developing said exposed resist in an alkaline medium at a temperature in the range of about 13° to about 15° C.;

determining the time for completion of development of at least one of said openings over a dedicated portion of said substrate, and continuing the development of said resist an additional 10 to 100% of said time; and heating said developed resist pattern over a period of about 20 to about 60 minutes to a final temperature of about 120 to 160±5° C., and baking said resist at said final temperature for a time in a range of about 10 to about 20 minutes, wherein said heating is raised to said final temperature at a ramp of about 2° to about 10° C./minute, with a bake at said final temperature for about 20 to 60 minutes.

3. A method for forming a pattern of openings in an alkali soluble and a photosensitive diazo benzophenone positive resist system, comprising:

forming an adhesion promoter layer on a substrate, wherein said adhesion promoter comprises a partially cyclized poly-cis-isoprene photoresist;

heating said adhesion promoter layer to desensitize it;

forming a layer of said resist system on and over said adhesion promoter layer;

exposing said resist with an electron beam in a predetermined pattern of said openings;

developing said exposed resist in an alkaline medium at a temperature in the range of about 13° to 15° C.;

determining the time for completion of development of at least one of said openings over a dedicated portion of said substrate, and continuing the development of said resist for an additional 10 to 100% of said time; and heating said developed resist pattern over a period of about 10 to about 20 minutes to a final temperature of about 120 to 160±5° C., and baking said resist at said final temperature for a time in the range of about 10 to about 20 minutes.

4. A method for forming a pattern of openings in an alkali soluble and a photosensitive diazo benzophenone positive resist system, comprising:

forming an adhesion promoter layer on a substrate, wherein said adhesion promoter comprises a partially cyclized poly-cis-isoprene photoresist;

heating said adhesion promoter layer to desensitize it;

forming a layer of said resist system on and over said adhesion promoter layer, wherein said resist system includes a cresol/formaldehyde novolak and said benzophenone is 2,4, bis (6-diazo-5,6-dihydro-5-oxo-1-naphthalene-sulfonoxyl-benzophenone;

exposing said resist in with an electron beam in a predetermined pattern of said openings;

developing said exposed resist in an alkaline medium at a temperature in the range of about 13° to about 15° C.;

determining the time for completion of development of at least one of said openings over a dedicated portion of said substrate, and continuing the development of said resist for an additional 10 to 100% of said time; and heating said developed resist pattern over a period of about 20 to about 60 minutes to a final temperature of about 120 to 160±5° C., and baking said resist at said final temperature for a time in the range of about 10 to about 20 minutes.

5. A method for forming a pattern of openings in an alkali soluble and photosensitive diazo benzophenone positive resist system, comprising:

forming an adhesion promoter layer on a substrate, wherein said adhesion promoter comprises a partially cyclized poly-cis-isoprene photoresist, heating said adhesion promoter layer to desensitize it;

forming a layer of said resist system on and over said adhesion promoter layer, wherein said resist system includes a novolak of cresol and formaldehyde, and said benzophenone is 2,4-bis(6-diazo-5,6-dihydro-5-oxo-1-naphthalene-sulfonoxyl)-benzophenone;

exposing said resist with an electron beam in a predetermined pattern of said openings;

developing said exposed resist in an alkaline medium at a temperature in the range of about 13° to 15° C.;

determining the time for completion of development of at least one of said openings over a dedicated portion of said substrate, and continuing the development of said resist for additional 10 to 100% of said time;

heating said developed resist pattern over a period of about 20 to about 60 minutes to a final temperature of about 120 to 160±5° C., and baking said resist at said final temperature for a time in the range of about 10 to about 20 minutes, wherein the last said heating is performed in a step-wise manner, with a first bake at about a temperature of about 80 to 90±5° C. for about 10 to about 20 minutes, a second bake at a temperature of about 100° to about 120° C. for about 10 to about 20 minutes, and a bake at said final temperature from about 10 to about 20 minutes.

6. A method for forming a pattern of openings in an alkali soluble and a photosensitive diazo benzophenone positive resist system, comprising:

forming an adhesion promoter layer on a substrate wherein said adhesion promoter comprises a partially cyclized poly-cis-isoprene photoresist; heating said adhesion promoter layer to desensitize it;

forming a layer of said resist system on and over said adhesion promoter layer;

exposing said resist with an electron beam in a predetermined pattern of said openings;

developing said exposed resist in an alkaline medium at a temperature in the range of about 13° to about 15° C.; determining the time for completion of development of at least one of said openings over a dedicated portion of said substrate, and continuing the development of said resist for an additional 10 to 100% of said times; and heating said developed resist pattern over a period of about 20 to about 60 minutes to a final temperature of about 120° to 160°±5° C., and baking said resist at said temperature for a time in the range of about 10 to about 20 minutes, wherein said heating is raised to said final temperature at a ramp of about 2° to about 10° C./minute, with a bake at said final temperature for about 20 to about 60 minutes.

7. A method of forming via holes through a dielectric insulating coating disposed over a conductive pattern of integrated circuit chips contained in a semiconductor substrate, wherein said coating is selected from the group of quartz and silicon dioxide, comprising:

forming a layer of an adhesion promoter on said coating, wherein said layer of an adhesion promoter comprises a partially cyclized poly-cis-isoprene photoresist,; heating said adhesion promoter layer to desensitize it;

forming on said adhesion promoter layer a layer of an alkali soluble novolak-diazo phenone positive resist system;

exposing said resist system with an electron beam and a pattern of openings corresponding to said via holes at predetermined points of contact with said conductor pattern;

developing said exposed resist system in an alkaline medium at a temperature in the range of about 13° to about 15° C.; determining the time for completion of development of at least one of said holes over a dedicated part of said substrate; and (a) continuing the development of said resist system for an additional 10 to 100% of said time;

heating said substrate over a period of about 20 to about 60 minutes to a final temperature of about 120° to about 160° C.; and (a) baking said substrate at said final temperature for a time in the range of about 10 to about 20 minutes;

reactive ion etching said adhesion promoter layer exposed by said openings to form a corresponding pattern of second openings; and reactive ion etching said coating exposed by said second openings to form said via holes at said predetermined points.

8. The method of claim 7 wherein said heating is performed in a step-wise manner, with a first bake at a temperature of about 80° to 90°±5° C. for about 10 to about 20 minutes, a second bake at temperature of about 100° to about 120°±°C. for about 10 to about 20 minutes, and a bake at said final temperature for about 10 to about 20 minutes.

9. The method of claim 7 wherein said novolak is a cresol/formaldehyde, and said benzophenone is 2,4-bis(6-diazo-5,6-dihydro-5-oxo-1-naphthalene-sulfonoxy)-benzophenone.

10. The method of claim 7 wherein said heating is raised to said final temperature at a ramp of about 2° to about 10° C./minute, with a bake at said final temperature for about 20 to about 60 minutes.

11. The method of claim 10 wherein said heating is performed in a step-wise manner, with a first bake at a temperature of about 80° to 90°±5° C. for about 10 to about 20 minutes, a second bake at a temperature of about 100° to about 120°±°C. for about 10 to about 20 minutes, and a bake at said final temperature for about 10 to about 20 minutes.

* * * * *

UNITED STATES PATENT AND TRADEMARK OFFICE
CERTIFICATE OF CORRECTION

PATENT NO. : 4,409,319
DATED : October 11, 1983
INVENTOR(S) : James J. Colacino, Edward C. Fredericks and Ronald A. Leone It is certified that error appears in the above—identified patent and that said Letters Patent is hereby corrected as shown below:

On the cover page, item [75] add co-inventor

--Edward C. Fredericks, Haymarket, Va.--.

Signed and Sealed this

Twelfth Day of June 1984

[SEAL]

Attest:

GERALD J. MOSSINGHOFF

Attesting Officer​ Commissioner of Patents and Trademarks